United States Patent [19]

Tsuji

[11] Patent Number: 5,286,342
[45] Date of Patent: Feb. 15, 1994

[54] METHOD OF MANUFACTURING LEAD FRAME USED IN ELECTRONIC COMPONENT

[75] Inventor: Masahiro Tsuji, Kyoto, Japan

[73] Assignee: Rohm Co., Ltd., Kyoto, Japan

[21] Appl. No.: 957,428

[22] Filed: Oct. 5, 1992

[30] Foreign Application Priority Data

Oct. 11, 1991 [JP] Japan .................... 3-263771

[51] Int. Cl.$^5$ ............................ B44C 1/22; C23F 1/00
[52] U.S. Cl. ..................................... 156/645; 156/651; 156/659.1; 156/902; 29/827; 257/666; 437/220
[58] Field of Search ...................... 156/644, 654, 659.1, 156/902, 645, 651; 29/827; 357/70; 437/206, 217, 220; 361/421

[56] References Cited

U.S. PATENT DOCUMENTS

| | | | |
|---|---|---|---|
| 3,611,061 | 10/1971 | Segerson | 437/220 X |
| 3,795,044 | 3/1974 | Peltz | 437/220 X |
| 4,704,187 | 11/1987 | Fujita | 156/901 X |
| 4,711,700 | 12/1987 | Cusack | 29/827 X |
| 4,994,411 | 2/1991 | Naito et al. | 437/217 X |

*Primary Examiner*—William Powell
*Attorney, Agent, or Firm*—Brumbaugh, Graves, Donohue & Raymond

[57] ABSTRACT

The thickness of a portion of a metal plate for constituting a lead frame, which corresponds to a tip portion of respective lead terminals of the lead frame, is partially made thin by way of an etching treatment. Subsequently, the respective lead terminals of the lead frame are formed by a punching process or an etching process.

2 Claims, 5 Drawing Sheets

METHOD OF MANUFACTURING LEAD FRAME USED IN ELECTRONIC COMPONENT

BACKGROUND OF THE INVENTION

The present invention relates a method of manufacturing a lead frame used in an electronic component such as an IC (integrated circuit), or an LSI (large scale integration).

In general, electronic components such as an IC and an LSI have been widely known. Also, in a conventional lead frame, as shown in FIG. 10, an island portion "C" used for mounting a semiconductor chip "B" is integrally formed in one body on a lead frame "A" made of a thin metal plate, a large number of lead terminals "D" whose widths are made narrow are integrally formed in one body in such a manner that an inner lead "$D_1$" positioned at a tip portion of the respective lead terminals "D" is extended in a radial direction toward the island portion "C". These inner leads "$D_1$" positioned at the tip portions of the respective lead terminals "D" are mutually connected with the above-described semiconductor chip "B" by using very fine gold wires "E" by way of a wire bonding process, and thereafter the entire components are packaged by a mold unit made of a synthetic resin.

Recently, there is extremely increased the number of lead terminals owned by electronic components, for instance, ICs and LSIs, which are manufactured in high integration. To increase the total number of lead terminals without making these electronic components bulky, the width size "$W_1$" of the inner lead $D_1$ at the tip portion of the respective lead terminals "D" must be narrowed and also the pitch interval "P" between the adjoining inner leads "$D_1$" must be shortened. In case that these lead terminals are formed from a thin metal plate by a conventional punching process or the conventional etching process, both of the width size "$W_1$" of the each inner lead at the tip portion of the respective lead terminals and the interval dimension "$W_2$" between the adjoining inner leads cannot be reduced less than 80% of the thickness of this metal lead frame.

Conventionally, the width size W of the inner lead $D_1$ of the respective lead terminals is narrowed and also the pitch interval "P" between the adjoining inner leads "$D_1$" is narrowed by making the thickness of a raw metal plate "A" thinner, which is used for the lead frame. However, when the thickness of the metal plate used for the lead frame "A" is made thinner, the thickness of the entire lead terminal "D" becomes thinner, so that strength of outer lead portion of the lead terminal "D", which projects from the mold portion, is lowered. As a result, since the thin outer lead portion is extremely apt to be deformed, there is a limitation in increasing the degree of integration of an electronic component by making the thickness of the lead frame "A" thin. In other words, there is a problem that provision of a large number of lead terminals may cause a bulky electronic component.

SUMMARY OF THE INVENTION

An object of the present invention is to provide a method of manufacturing a lead frame, capable of solving the above-described problem.

To achieve the object, according to the present invention, after a portion of a raw metal plate to be formed into a tip portion of each lead terminal of a lead frame is partially made thin by way of an etching process, each lead terminal of the lead frame is formed by subjecting the metal plate to a punching process or an etching process.

With employment of such a manufacturing method of a lead frame, since the thickness of the inner lead portion at the tip portion of the respective lead terminals can be made thinner than the thickness of the portion other than the inner lead portion at the tip portion, the width size of the inner lead portion of the respective lead terminals can be narrowed by a size determined by making the thickness of the inner lead portion thin, without making the thickness of the outer lead portion thin at the respective lead terminals. Furthermore, the pitch interval between the adjoining inner leads can be narrowed by a size determined by making the thickness of the inner lead portion thin, without making the thickness of the outer lead portion thin at the respective lead terminals.

As a consequence, in accordance with the present invention, there are particular advantages that high integration of the electronic component, namely provision of a large number of lead terminals, can be achieved without lowering the strengths of the outer lead portions which project from the mold portion, and also the electronic component can be made compact.

DETAILED DESCRIPTION OF THE INVENTION

Referring now to drawings (FIGS. 1 to 9), an embodiment of the present invention will be described.

Figure 1:
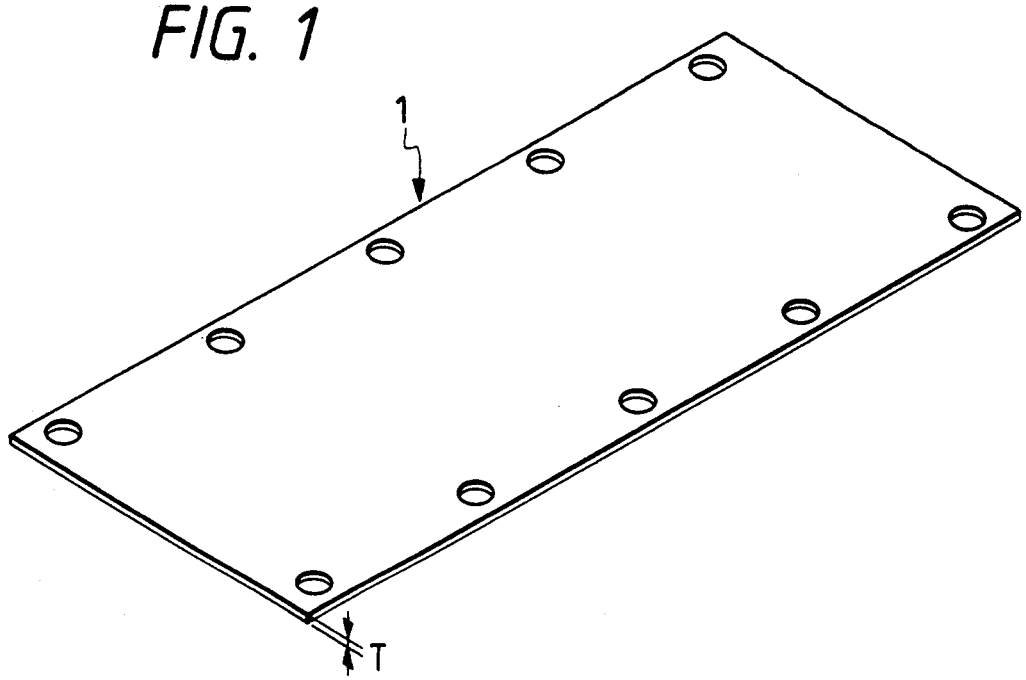
FIG. 1 is a perspective view of a raw metal plate used in an embodiment of the present invention.
Figure 2:
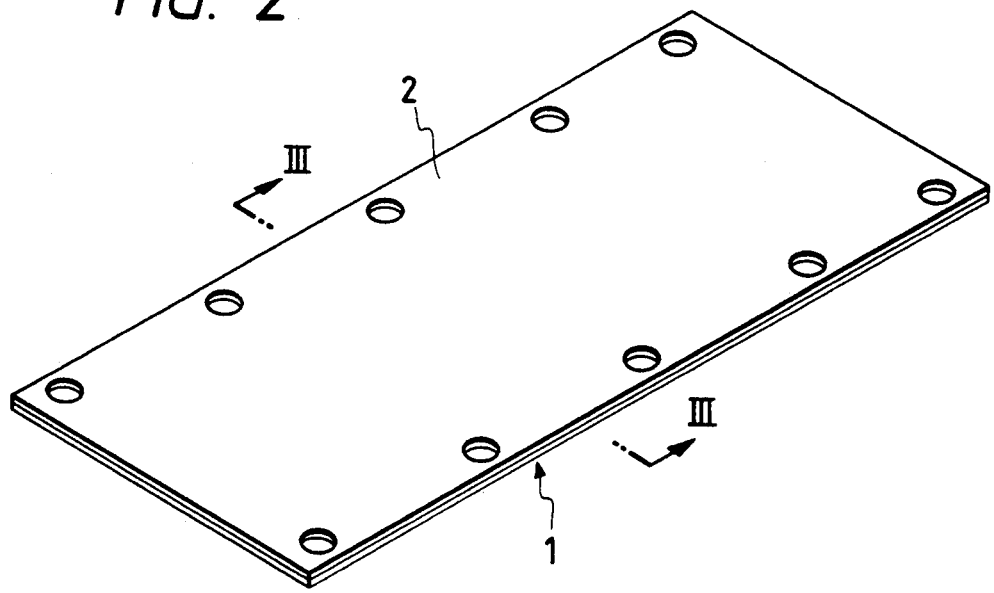
FIG. 2 is a perspective view of such a state that a photoresist film has been formed on the upper surface of the metal plate shown in FIG. 1.
Figure 3:
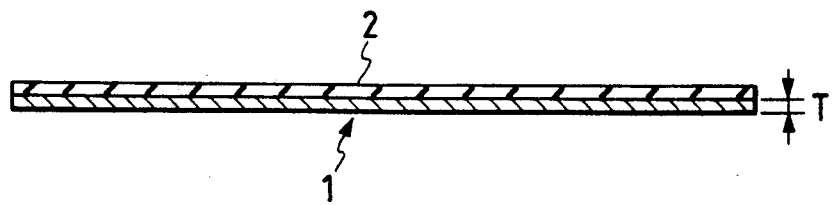
FIG. 3 is an enlarged sectional view of the metal material plate, taken along a line III—III of FIG. 2.
Figure 4:
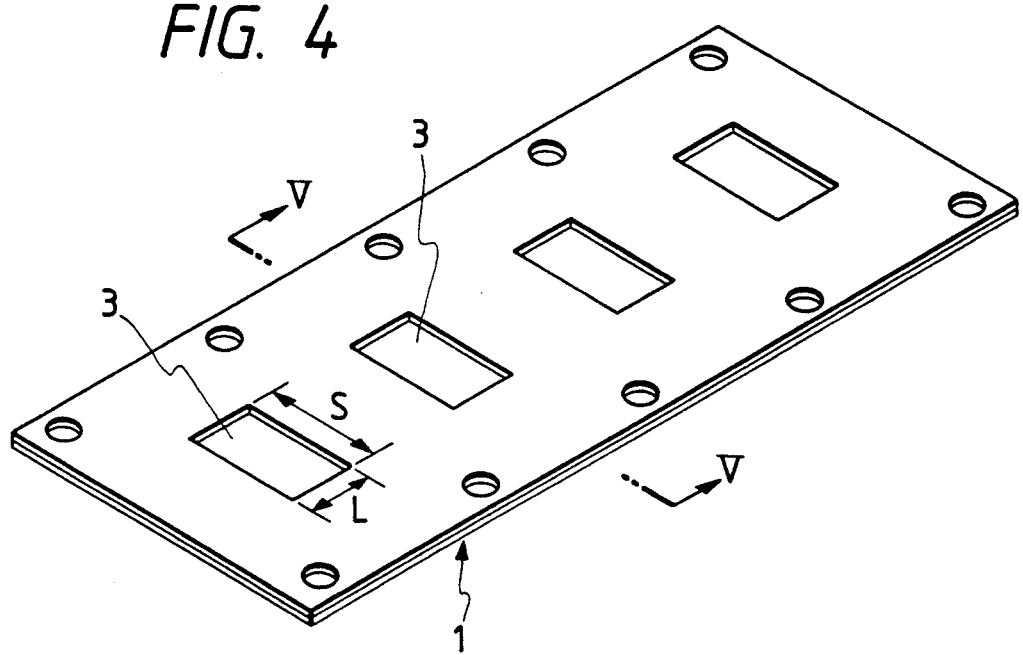
FIG. 4 is a perspective view of such a state that punching windows have been formed on the photoresist film.
Figure 5:
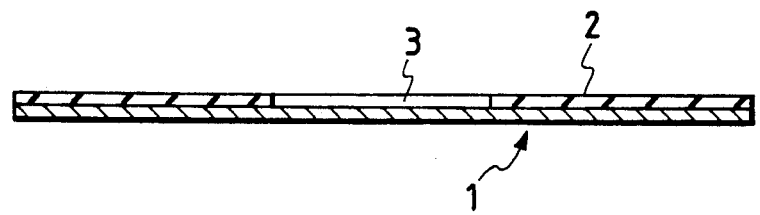
FIG. 5 is an enlarged sectional view of the metal plate, taken along a line V—V of FIG. 4.

In the drawings, reference numeral 1 denotes a raw metal plate having a thickness of "T", which is formed into a lead frame "A". As shown in FIGS. 2 and 3, a photoresist 2 having a properly selected thickness is formed on an upper surface of the metal plate 1 in such a manner that the photoresist 2 covers the overall upper surface of the metal plate 1. Thereafter, as shown in FIGS. 4 and 5, punching windows 3 having a length of "L" and a width of "S" are formed in the photoresist film 2, which correspond to an island portion "C" and tip portions of the respective lead terminals "D" of the lead frame A, by exposing and developing the photoresist film 2 with providing a mask.

Then, the upper surface of the metal plate 1 is dipped into an etching fluid, so that the portions of the upper surface of the metal plate 1 within the punching windows 2 in the photoresist film 2 are etched by the etching fluid to form concave portions 4. As a result, a thickness "$T_1$" of this portion can be made thinner than the thickness "T" of the other portion, namely the portion covered by the photoresist film 2.

Figure 6:
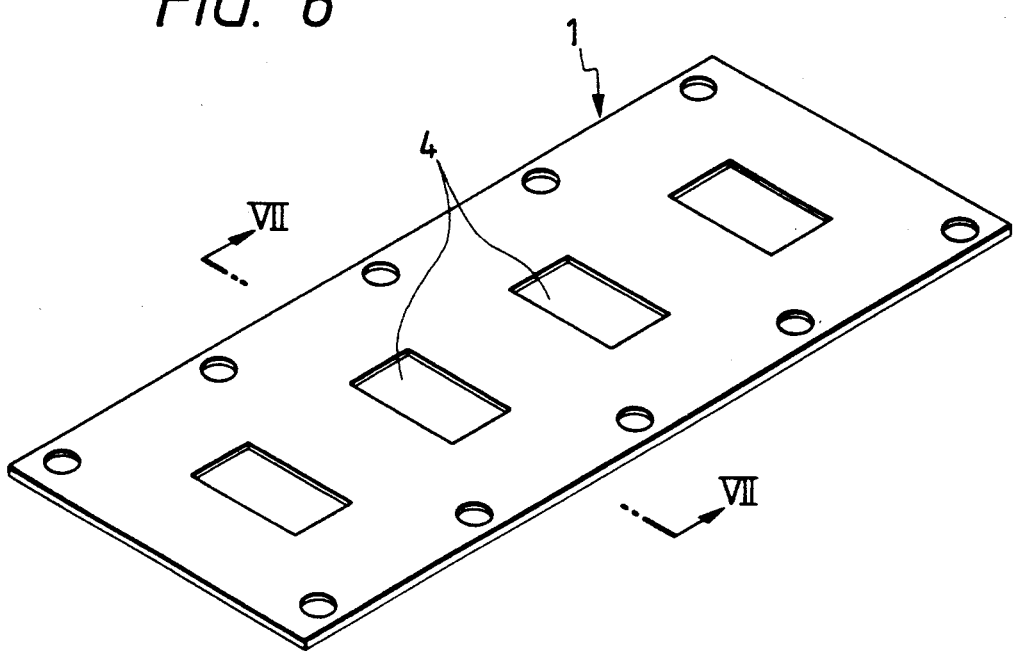
FIG. 6 is a perspective view of a lead frame after the metal plate is etched.
Figure 7:
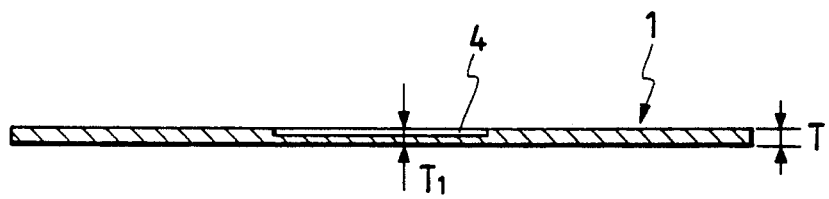
FIG. 7 is an enlarged sectional view of the lead frame taken along a line VII—VII of FIG. 6.
Figure 8:
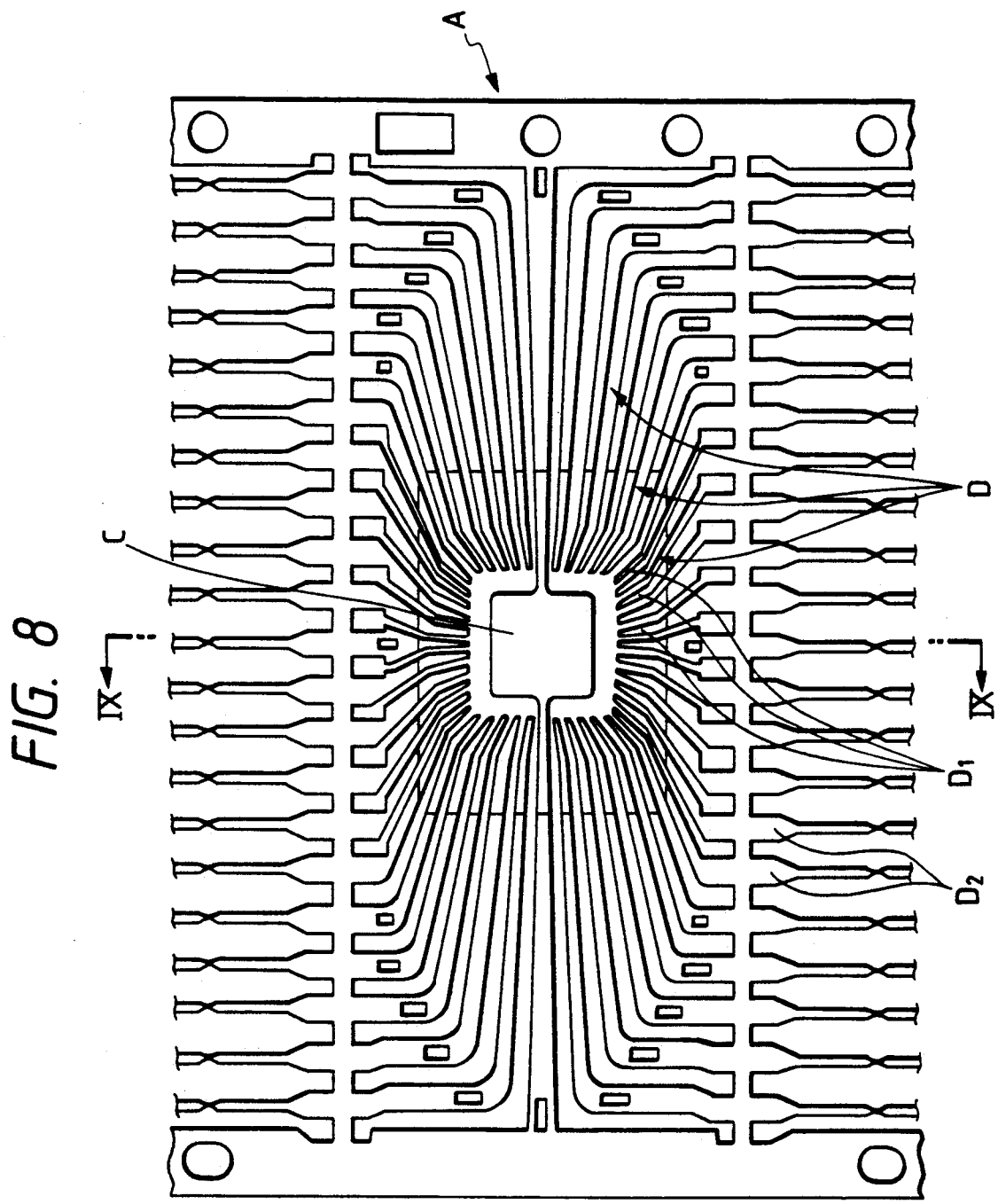
FIG. 8 is a plan view of the lead frame according to the present invention.
Figure 9:
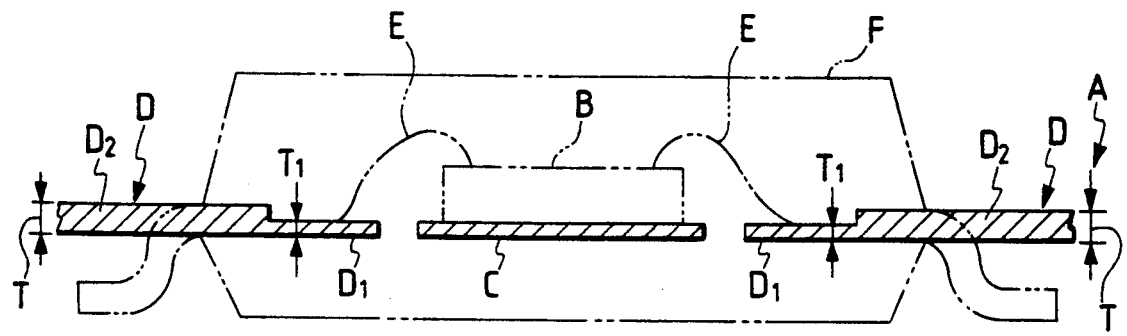
FIG. 9 is an enlarged sectional view of the lead frame, taken along a line IX—IX of FIG. 8.
Figure 10:
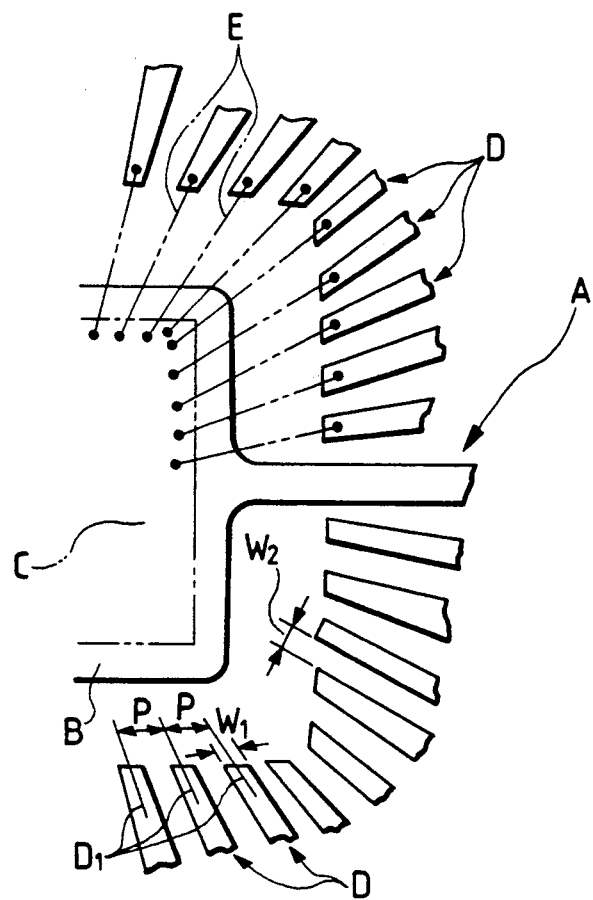
FIG. 10 is an enlarged view of a major portion of a conventional lead frame.

Then, as shown in FIGS. 6 and 7, all of the photoresist film 2 covering the upper surface of the metal plate 1 has been completely removed by way of the proper removing means. Thereafter, a lead frame "A" equipped with the island portion "D" and a large number of lead terminals "D" is formed from the metal plate 1, as shown in FIG. 8, by a punching treatment using an accept die (not shown) and a pulling punch (not shown), or by an etching treatment.

The thus formed lead frame "A" is processed to form a complete electronic component in such a manner that a semiconductor chip "B" is die-bonded on the upper surface of the island portion "C", subsequently, this semiconductor chip "B" is connected to the inner leads "$D_1$" positioned at the tip portions of these lead terminals "D" by narrow gold wires "E" by way of the wire bonding treatment, and thereafter the entire component is packaged by a mold portion "F" made of a thermosetting resin. Next, these lead terminal "D" are cut away from the lead from A, and the outer leads $D_2$ of the lead terminals D, which project from the mold portion "F", are formed in a proper form as indicated by a two-dot long and two short dashes line of FIG. 9.

Since the thickness "$T_1$" of the tip portion of the respective lead terminal "D" can be made thinner than the thickness "T" of the portion other than the first-mentioned tip portion by manufacturing the lead frame "A" in accordance with the above-described manner, the width size of the inner lead portion "$D_1$" of the respective lead terminals "D" can be narrowed without decreasing the thickness of the outer lead portion "$D_2$" of the respective lead terminals "D", and also the pitch interval between the adjoining inner leads "$D_1$" can be similarly narrowed without decreasing the thickness of the outer lead portion "$D_2$" of the respective lead terminals "D".

It should be noted that although the description of the above-described embodiment has been made to the case in which the thickness of the tip portion of the respective lead terminals "D" is made thin and additionally, the thickness of the island portion "C" is made thin, the present invention is not limited thereto, but may be modified. For instance, only the thickness of the tip portion of the respective lead terminals "D" may be made thin.

What is claimed is:

1. A method of manufacturing a lead frame used in an electronic component, comprising the steps of:

etching an unpatterned portion on one side of a metal plate including a region to be formed subsequently into a tip portion of each lead terminal of said lead frame without etching the opposite side of the plate to produce an unpatterned recess on one side of the metal plate and an unrecessed surface on the opposite side of the metal plate; and forming said each lead terminal of said lead frame by subjecting both the unrecessed portion and the recessed portion of said metal plate to a punching process or an etching process.

2. A method of manufacturing a lead frame used in an electronic component, comprising the steps of:

etching a portion of a metal plate to be formed into a tip portion of each lead terminal of said lead frame to make said portion thin; and forming said each lead terminal of said lead frame by subjecting said metal plate to a punching process or an etching process, wherein said portion includes an island portion of said lead frame on which a semiconductor chip is to be mounted.

* * * * *